United States Patent [19]
Hasegawa et al.

[11] Patent Number: 5,201,653
[45] Date of Patent: Apr. 13, 1993

[54] SUBSTRATE HEAT-TREATING APPARATUS

[75] Inventors: Moriyoshi Hasegawa; Yoshio Matsumura; Yoshiteru Fukutomi, all of Kyoto, Japan

[73] Assignee: Dainippon Screen Mfg. Co., Ltd., Kyoto, Japan

[21] Appl. No.: 767,588

[22] Filed: Sep. 30, 1991

[30] Foreign Application Priority Data

Oct. 2, 1990 [JP] Japan .................................. 2-265923
Oct. 4, 1990 [JP] Japan ............................ 2-105053[U]

[51] Int. Cl.$^5$ ............................................. F27B 3/04
[52] U.S. Cl. ....................................... 432/170; 432/5; 432/241
[58] Field of Search .................. 432/241, 5, 6, 152, 432/255, 162, 163, 170

[56] References Cited

U.S. PATENT DOCUMENTS

| 2,191,438 | 2/1940 | Breeler | 432/241 |
| 3,780,674 | 12/1973 | Liu | 110/248 |
| 4,028,048 | 6/1977 | Woolworth | 432/5 |

Primary Examiner—Henry C. Yuen
Attorney, Agent, or Firm—Lowe, Price, LeBlanc & Becker

[57] ABSTRACT

An apparatus for heat-treating substrates includes a plurality of heat-treating units arranged in vertical stages, and at least one hollow column for supporting the heat-treating units. Each heat-treating unit has an exhaust line communicating with the column to exhaust gases from the heat-treating units through the column by suction.

5 Claims, 4 Drawing Sheets

SUBSTRATE HEAT-TREATING APPARATUS

BACKGROUND OF THE INVENTION

(1) Field of the Invention

The present invention relates to an apparatus for heat-treating substrates such as semiconductor wafers, glass substrates for photo-masking, and glass substrates for liquid crystal displays, in which the substrates are heated, cooled, or maintained at room temperature. Hereinbelow, the term "heat-treating" substrates is defined to include heating and cooling substrates alike.

(2) Description of the Related Art

A known heating apparatus which is one example of such heat-treating apparatus is disclosed in Japanese Patent Laying-Open Publication No. 1990-300159. In this apparatus, substrates are transported on what is known as a walking transport beam to be placed on and removed from a heating area. The hot plate is surrounded by adiabatic covering, and atmosphere in the hot plate is exhausted through a lateral position of the covering.

The above known apparatus has the following disadvantage.

Proposals have been made in recent years to use a plurality of heat-treating units in order to increase the number of substrates processed per unit time, the heat-treating units being arranged in vertical stages to save installation space of the apparatus. To exhaust gas as in the foregoing known apparatus from the individual heat-treating units arranged in vertical stages requires an increased number of exhaust ducts and the like, which results in a large overall construction of the apparatus.

SUMMARY OF THE INVENTION

The present invention has been made having regard to the state of the art noted above, and its object is to provide an apparatus for heat-treating substrates, which makes effective use of a construction having heat-treating units in a plurality of stages to achieve compactness, thereby reducing the overall size of the apparatus.

The above object is fulfilled, according to one aspect of the present invention, by an apparatus for heat-treating substrates in a plurality of heat-treating units arranged vertically, the apparatus comprising at least one hollow column for supporting the heat-treating units, and an exhaust line for communicating the heat-treating units with the column to exhaust gases from the heat-treating units through the column.

Specifically, each of the heat-treating units includes a heat-treating plate, and a box-like casing having an open top and housing the heat-treating plate in a manner to define a space in combination with the heat-treating plate. The space formed between the heat-treating plate and casing communicates with the hollow column through exhaust ports formed in the casing.

According to the present invention, the column for supporting the plurality of heat-treating units arranged vertically is used also as an exhaust duct. Thus, the exhaust ducts and the like provided for the individual units as in the prior art are no longer necessary. This feature allows a compact overall construction of the apparatus.

In accordance with another aspect of the invention, there is provided an apparatus for heat-treating substrates in a plurality of heat-treating units arranged vertically, each said heat-treating unit including a heat-treating plate; and a box-like casing having an open top and housing said heat-treating plate in a manner to define a space in combination with said heat-treating plate, which apparatus comprises substrate lift means mounted in said space and comprising a plurality of substrate supporting pins, said substrate supporting pins vertically extending through said heat-treating plate to support a substrate placed on said heat-treating plate, and being movable above and below an upper surface of said heat-treating plate; and shutter means for closing a substrate entry/exit opening defined in an upper cover extending over said heat-treating plate, said shutter means being operatively connected to said substrate lift means such that said shutter means is movable to a closed position when said substrate supporting pins are moved below the upper surface of said heat-treating plate, and to an open position when said substrate supporting pins are moved above the upper surface of said heat-treating plate.

Thus, in accordance with the invention, the same drive source may be shared by the substrate supporting pins vertically movable to raise and lower the substrate relative to the heat-treating plate and by the shutter means operable to open and close the substrate entry/exit opening defined in the upper cover extending over the heat-treating plate.

Preferably, said substrate lift means further comprises a reversing link pivotable about a pivotal point disposed at an intermediate position thereof; a support member for fixedly supporting said substrate supporting pins; a lift arm for supporting said support member; and drive means for vertically driving said lift arm; said reversing link being flexibly connected at one end thereof to said lift arm, and at the other end to a lift plate attached to said shutter means, respectively.

Thus, in accordance with the invention, the shutter means driven through the reversing link is in opposite phase to the vertical movement of the substrate supporting means. That is, the shutter means lies below the upper surface of the heat-treating plate during a standby in which the substrate supporting pins are raised for entry or exit of the substrate. In this state, the upper cover may be removed for enabling the heat-treating plate to be cleaned without the shutter means obstructing the cleaning operation. This feature, therefore, provides the advantage of facilitating cleaning of the heat-treating plate.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENT

A preferred embodiment of the present invention will be described in detail with reference to the drawings.

Figure 1:
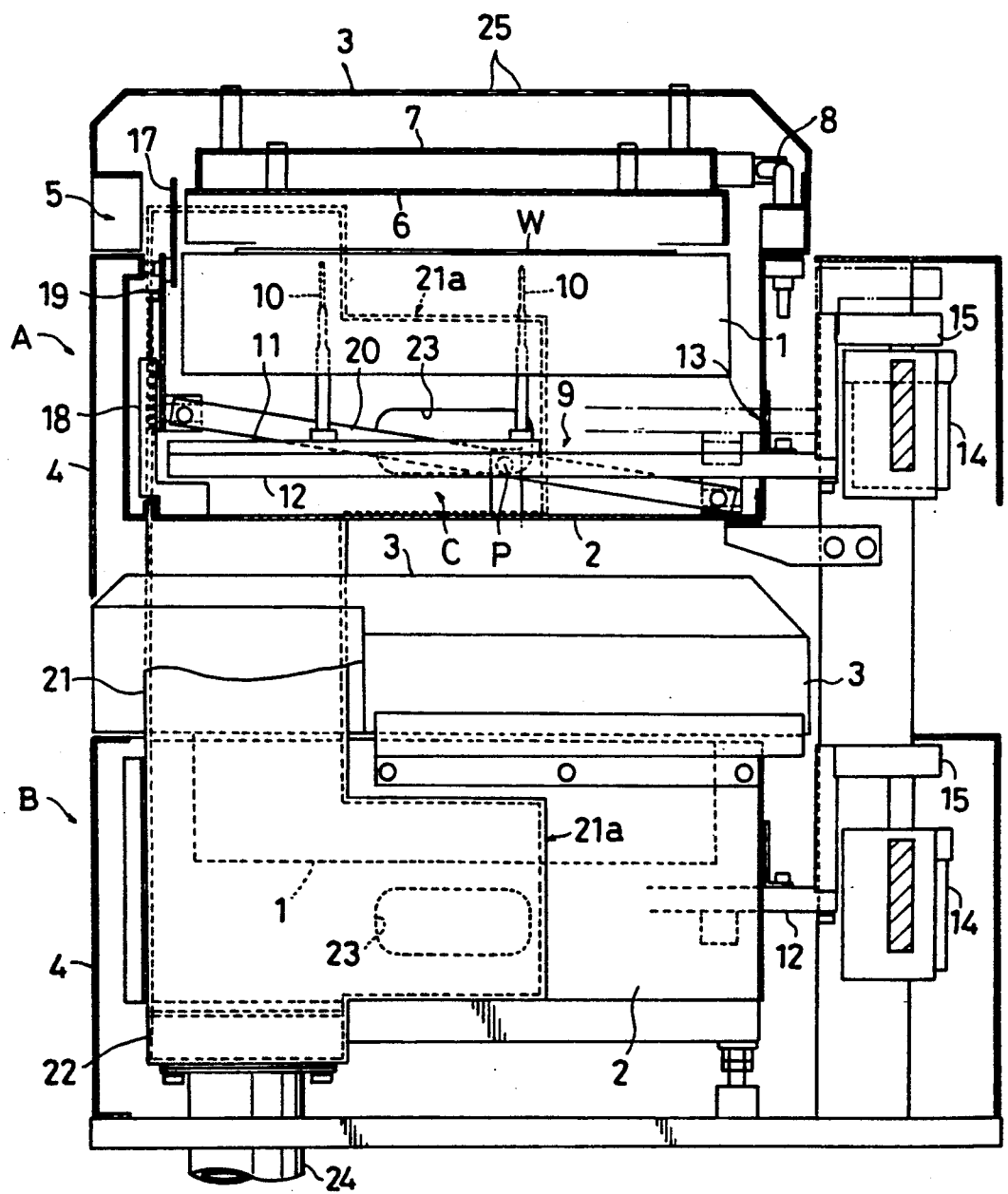
FIG. 1 is a side view in vertical section of a wafer heating apparatus which is one example of substrate heat-treating apparatus according to the present invention.
Figure 2:
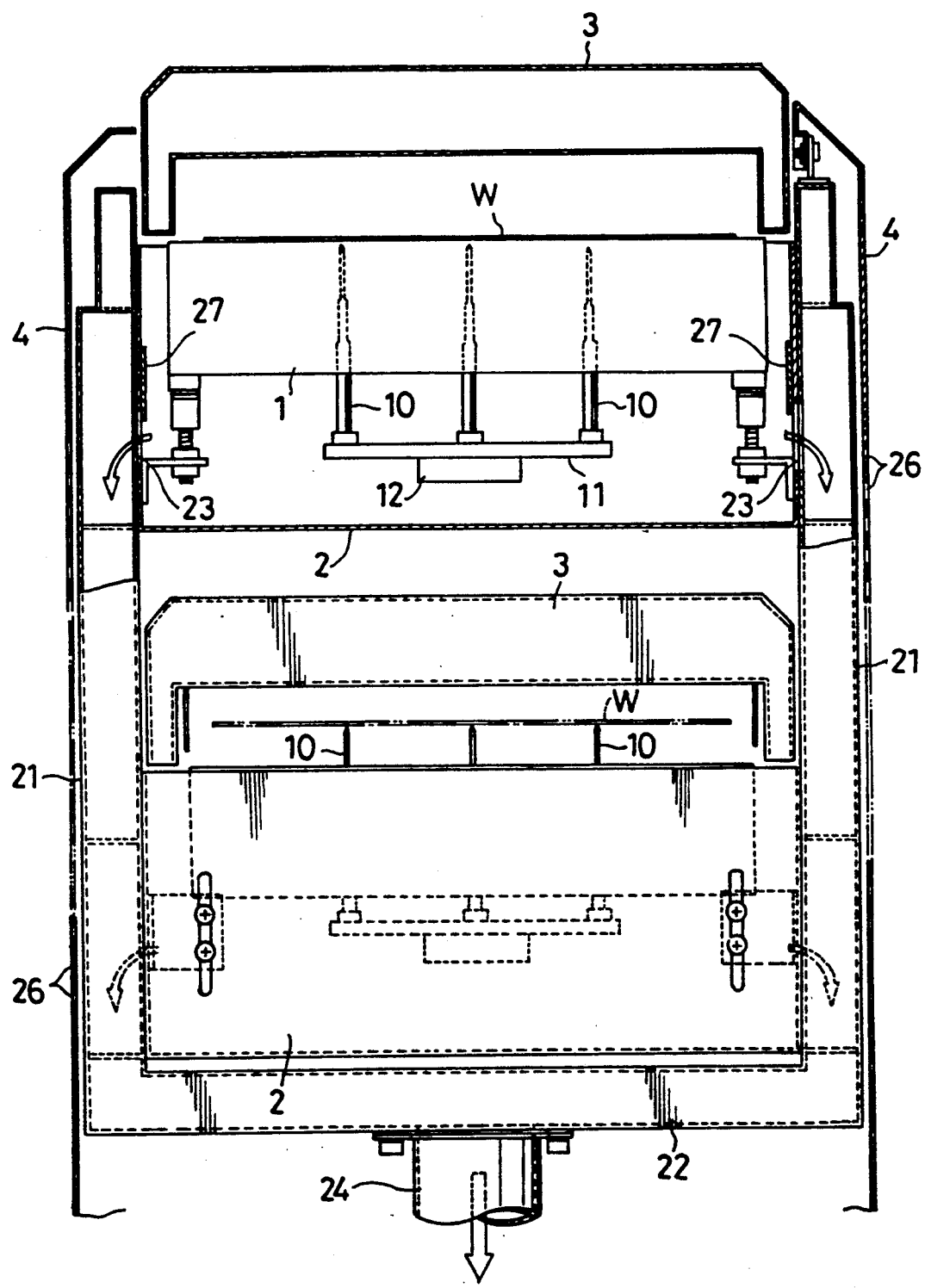
FIG. 2 is a front view of the heating apparatus.

The illustrated wafer heating apparatus has a plurality of heating units having the same construction and arranged one over another. FIG. 1 shows a first heating unit A and a second heating unit B in a vertical arrangement.

Each of the heating units A and B includes a hot plate 1 mounted in a box-shaped casing 2 having an open top. These components are enclosed in an upper cover 3 and side covers 4.

The upper cover 3 has a wafer entry/exit opening 5 in a front face thereof (left side in FIG. 1). A porous inner cover 6 is mounted inside the upper cover 3 to extend over the hot plate 1. A gas supply duct 7 is mounted on an upper surface of the inner cover 6. During a wafer heating operation, the gas supply duct 7 supplies nitrogen gas or a surface-treating gas through pores of the inner cover 6 to maintain a required gas atmosphere in a heating space over the hot plate 1. The gas supply duct 7 receives the gases from outside through a coupling 8.

A wafer lift mechanism 9 is disposed in a space C between a bottom surface of the hot plate 1 and a bottom surface of the casing 2. The lift mechanism 9 includes three wafer supporting pins 10 extending through the hot plate 1 to be movable between positions above an upper surface of the hot plate 1 and positions retracted below the upper surface.

Figure 3:
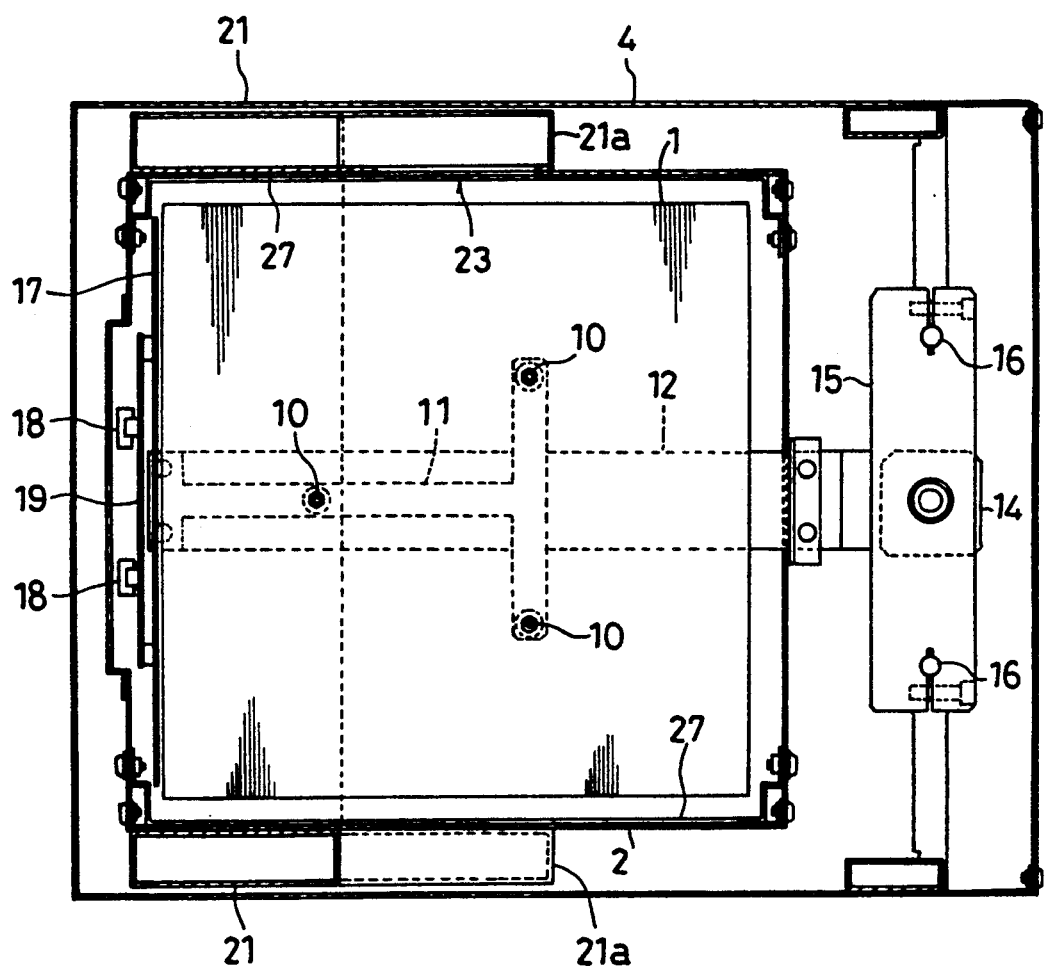
FIG. 3 is a cross section of the heating apparatus.
Figure 4:
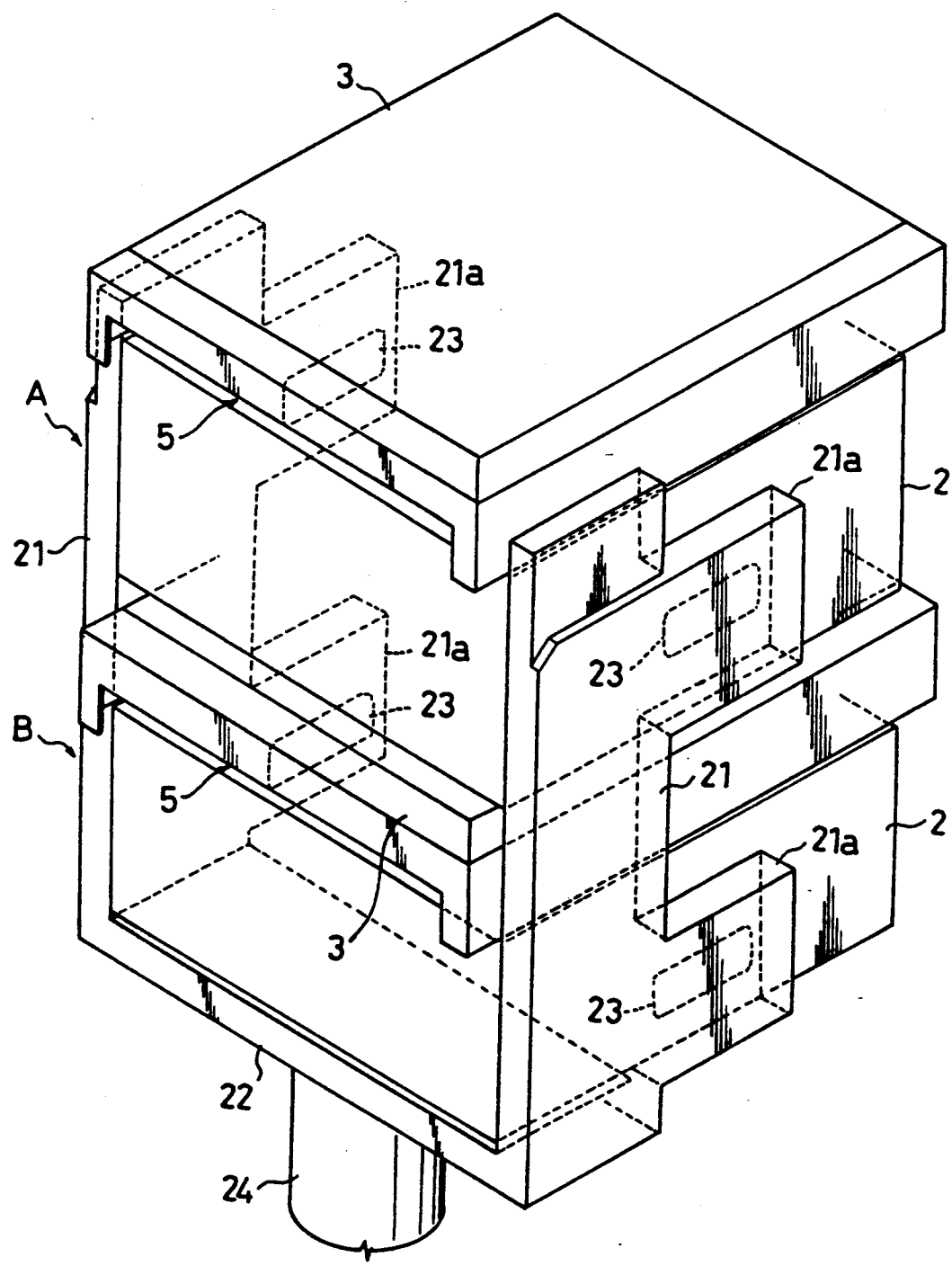
FIG. 4 is a perspective view of the entire heating apparatus.

As shown in FIG. 3, the wafer supporting pins 10 are fixedly erected on a T-shaped support 11 mounted on a forward end of a lift arm 12. As shown in FIG. 1, the lift arm 12 extends outward through an opening 13 defined in a rear wall of the casing 2, and connected at an outer end thereof to a movable element 15 vertically driven by an air cylinder 14. The movable element 15 is guided in its vertical movement by a pair of parallel guide rods 16 (FIG. 3).

The wafer entry/exit opening 5 has a shutter 17 driven by the lift arm 12. The shutter 17 is attached to a lift plate 19 vertically slidable along a pair of guides 18. The lift plate 19 is operatively connected to the lift arm 12 through a reversing link 20 oscillatable about a pivotal point P.

Thus, in a heating state, as depicted with the first heating unit A in FIG. 1, the lift arm 12 is lowered by the air cylinder 14, to retract the wafer supporting pins 12 down from the upper surface of the hot plate 1, leaving a wafer W on the hot plate 1. To attain this heating state, the reversing link 20 is caused to pivot clockwise in FIG. 1 to raise the lift plate 19, thereby closing the wafer entry/exit opening 5 with the shutter 17. When the air cylinder 14 is extended, the lift arm 12 is raised to project the wafer supporting pins 10 above the hot plate 1 to be ready for wafer transport. At this time, the reversing link 20 is swung counterclockwise to lower the lift plate 19 and open the shutter 17.

The upper and lower heating units A and B as constructed above are supported between hollow, square columns 21 erected on right and left sides thereof. These columns 21 are interconnected at lower ends thereof through a communicating section 22. As shown in FIG. 1, each column 21 has two rearward extensions 21a.

Each heating unit A or B includes exhaust ports 23 defined in right and left walls of the casing 2 surrounding the space C in which the wafer lift mechanism 9 is mounted. These exhaust ports 23 communicate with the rearward extensions 21a of the columns 21. An exhaust pipe 24 extends downward from the communicating section 22 to be connected to a suction device not shown.

Hot atmosphere in the space C between the hot plate 1 and casing 2 is forcibly drawn through the exhaust ports 23 by a suction applied thereto. Further, plural pores 25 and 26 are formed in an upper surface of the upper cover 3 and in the right and left side covers 4. Ambient air is drawn in through these pores 25 and 26 to the space C between the hot plate 1 and casing 2, and exhausted through the exhaust ports 23.

The respective exhaust ports 23 have vertically movable plates 27 for opening degree adjustment thereof, so that a uniform exhaust may be made throughout the exhaust ports 23.

The "heat-treating units" of the present invention include not merely hot plates 1 as in the foregoing embodiment but also cool plates for cooling wafers and just ordinary supporting plates for maintaining the wafers at room temperature.

The downward exhaust from the columns 21 in the described embodiment is not limitative, but the gases may be drawn upward, for example.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for heat-treating substrates in a plurality of heat-treating units arranged vertically, wherein each of said heat-treating units includes a heat-treating plate, and a box-like casing which has an open top and houses said heat-treating plate in a manner to define a space in combination with said heat-treating plate, said apparatus comprising:

at least one hollow column for supporting said heat-treating units;

an exhaust line for communicating said heat-treating units with said column to exhaust gases from said heat-treating units through said column; and substrate lift means mounted in said space and comprising a plurality of substrate supporting pins vertically extending through said heat-treating plate to support a substrate placed on said heat-treating plate, said substrate supporting pins being movable above and below an upper surface of said heat-treating plate.

2. An apparatus as defined in claim 1, further comprising shutter means for closing a substrate entry/exit opening defined in an upper cover extending over said heat-treating plate, said shutter means being operatively connected to said substrate lift means such that said shutter means is movable to a closed position when said substrate supporting pins are moved below the upper surface of said heat-treating plate, and to an open position when said substrate supporting pins are moved above the upper surface of said heat-treating plate.

3. An apparatus as defined in claim 2, wherein said substrate lift means further comprises:

a reversing link pivotable about a pivotal point disposed at an intermediate position thereof;

a support member for fixedly supporting said substrate supporting pins;

a lift arm for supporting said support member; and drive means for vertically driving said lift arm;

said reversing link being flexibly connected at one end thereof to said lift arm, and at the other end to a lift plate attached to said shutter means, respectively.

4. An apparatus for heat-treating substrates in a plurality of heat-treating units arranged vertically, each said heat-treating unit including a heat-treating plate; and a box-like casing having an open top and housing said heat-treating plate in a manner to define a space in combination with said heat-treating plate, said apparatus comprising:

substrate lift means mounted in said space and comprising a plurality of substrate supporting pins, said substrate supporting pins vertically extending through said heat-treating plate to support a substrate placed on said heat-treating plate, and being movable above and below an upper surface of said heat-treating plate; and shutter means for closing a substrate entry/exit opening defined in an upper cover extending over said heat-treating plate, said shutter means being operatively connected to said substrate lift means such that said shutter means is movable to a closed position when said substrate supporting pins are moved below the upper surface of said heat-treating plate, and to an open position when said substrate supporting pins are moved above the upper surface of said heat-treating plate.

5. An apparatus as defined in claim 4, wherein said substrate lift means further comprises:

a reversing link pivotable about a pivotal point disposed at an intermediate position thereof;

a support member for fixedly supporting said substrate supporting pins;

a lift arm for supporting said support member; and drive means for vertically driving said lift arm;

said reversing link being flexibly connected at one end thereof to said lift arm, and at the other end to a lift plate attached to said shutter means, respectively.

* * * * *